US005493527A

United States Patent [19]
Lo et al.

[11] Patent Number: 5,493,527
[45] Date of Patent: Feb. 20, 1996

[54] HIGH DENSITY ROM WITH SELECT LINES

[75] Inventors: Han-Shen Lo; Te-Sun Wu, both of Hsin-Chu; Stephen S. Fu, Chung-Li, all of Taiwan

[73] Assignee: United Micro Electronics Corporation, Hsinchu, Taiwan

[21] Appl. No.: 370,569

[22] Filed: Jan. 9, 1995

Related U.S. Application Data

[63] Continuation of Ser. No. 111,942, Aug. 26, 1993, abandoned.
[51] Int. Cl.$^6$ ..................................................... G11C 11/34
[52] U.S. Cl. .......................... 365/185.11; 365/51; 365/63; 365/104; 365/189.01
[58] Field of Search ........................... 365/51, 63, 189.01, 365/185, 104, 230.03

[56] References Cited

U.S. PATENT DOCUMENTS 5,117,389  5/1992  Yiu ............................................ 365/104
5,241,497  8/1993  Komarek .................................. 365/185
5,268,861  12/1993  Hotta ....................................... 365/104

Primary Examiner—David C. Nelms
Assistant Examiner—F. Niranjan
Attorney, Agent, or Firm—George O. Saile; Jerry Jones

[57] ABSTRACT

A read only memory cell array and method of operation thereof comprises an array of memory transistor cells, a plurality of word lines, a plurality of bit lines, a plurality of select bit lines, a plurality of bank select lines for enabling reading of a selected bank in the array connected to bank select transistors in the bank, a select even line adapted for enabling reading of even cells in a selected bank connected to select even cell transistors in the bank, and a select odd line adapted for enabling reading of odd cells in a selected bank connected to select odd cell transistors in the array.

22 Claims, 4 Drawing Sheets

HIGH DENSITY ROM WITH SELECT LINES

The application is a continuation of application Ser. No. 08/111,942 filed on Aug. 26, 1993, now abandoned.

BACKGROUND OF THE INVENTION

1. Field of the Invention

This invention relates to semiconductor integrated circuits and more particularly to high density read only memory devices and methods of operation of a high density ROM.

2. Description of Related Art

Okada et al "16Mb ROM Design Using Bank Select Architecture", 1988 Symposium on VLSI Circuits, pages 85–86 describes a 16Mb ROM, with diffusion bit lines. In order to reduce the series bit line resistance, the ROM is divided into 256 banks, each of which has 16 word lines. The diffusion bit lines in each bank are connected to metallic (aluminum) lines via the bank select transistors. The aluminum lines are the main bit lines and the virtual ground lines which are used in pairs for reading out the ROM cell array data. Two diffusion bit lines are provided for each metallic bit line as a layout ground rule with odd and even bank select transistors connected alternatively. The disadvantage of the design is leakage causing problems (during reading or during standby as well) possibly leading to false "on" readings when the circuit was "off". There is a reduced margin with sense amplifiers. In addition, it is required that the overlap of each polysilicon word line in the select area over the buried N+ line, taking up needed space. Particularly with smaller feature sizes ≦0.8 µm produces rounding of the end of the buried N+ bit lines due to lithography limitations, so overlap is required on the bit line side. The misalignment of the polysilicon word lines to the buried N+ bit lines is the principal disadvantage of Okada et al.

U.S. Pat. No. 5,151,375 of Kazerounian et al for "EPROM Virtual Ground Array" describes an EPROM with floating gate transistors and select transistors in an array. Select transistors are duplicated to reduce line resistance. The select transistors are aligned in the same direction as the cell transistors. Therefore, there is not the overlap bit line problem found in the Okada et al. However, sensing cannot share two word lines with one decoder line, because otherwise a false reading is possible. The main disadvantage of the cell of of Kazerounian et al is that the row decoder scheme in combination with each ROM bank is complex.

An object of this invention is to provide sensing sharing two word lines with one decoder line.

Another object of this invention is to avoid leakage causing problems (during reading or during standby as well) possibly leading to false "on" readings when the circuit was "off".

Another object of this invention is to improve the margin with sense amplifiers.

A further object is to avoid overlap of each polysilicon word line in the select area over the buried N+ line which takes up space.

Still another object of this invention is to avoid misalignment of the polysilicon word lines to the buried N+ bit lines.

SUMMARY OF THE INVENTION

A read only memory cell array and method of operation thereof comprises an array of memory transistor cells, a plurality of word lines, a plurality of bit lines, a plurality of select bit lines, a plurality of bank select lines for enabling reading of a selected bank in the array connected to bank select transistors in the bank, a select even line adapted for enabling reading of even cells in a selected bank connected to select even cell transistors in the bank, and a select odd line adapted for enabling reading of odd cells in a selected bank connected to select odd cell transistors in the array. Preferably, the select even lines are connected to the gates of FET transistors which connect to the even cell transistors in the array, and the select odd lines are connected to the gates of FET transistors which connect to the odd cell transistors in the array. Preferably, the FET transistors connect to the bit lines of said odd cell transistors and the even cell transistors respectively. Preferably, the bank select transistors are connected to energize the select even transistors and the select odd transistors, when the bank select transistors are energized. Preferably, the bit lines comprise buried N+ bit lines. Preferably, the bank select transistors are connected to the column decoder of the cell array. Preferably, the select even lines are connected to the gates of FET transistors which connect to the even cell transistors in the array, and the select odd lines are connected to the gates of FET transistors which connect to the odd cell transistors in the array. Preferably, the cell transistors connect to the bit lines of said odd cell transistors and the even cell transistors respectively for selective energization of the cells. Preferably, the bank select transistors are connected to energize the select even transistors and the select odd transistors, when the bank select transistors are energized. Preferably, the bit lines comprise buried N+ bit lines. Preferably, the bank select transistors are connected to the column decoder of the cell array.

This invention provides a ROM cell array which overcomes the disadvantages of the prior art cited above.

Firstly, due to the insertion of bank select transistors which partition the whole cell array into several banks, sharing of two word lines with one decoder line is possible, making row decoder schemes much less complex and thereby overcoming the problem of Kazerounian et al, described above. By means of the cell array scheme of this invention, a very high density and high performance ROM can be made.

Secondly, because of the alignment of bank select transistors in the parallel direction to the cell array transistors, the misalignment of the polysilicon word lines to the buried N+ bit lines is solved, overcoming the principal disadvantage of Okada et al, discussed above.

According to the teachings of this invention, the bank select transistors are of the same structure as that of a ROM cell transistor, which are normally buried N+ transistors. In fact there is no field oxide region in the entire cell array and it is totally "flat." This facilitates control of the manufacturing process.

A two step scheme for decoding is provided by this invention, comprising the bank select transistors and the select transistors. The bank select transistors are responsible for activation on of banks of whole cell array. The select transistors are responsible for selecting the left or right column of an accessed cell.

Through the two step decoding scheme, one metal main bit line can be laid in a two buried N+ bit line pitch. It greatly relieves the metal rule in the cell array region, and makes high density possible.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
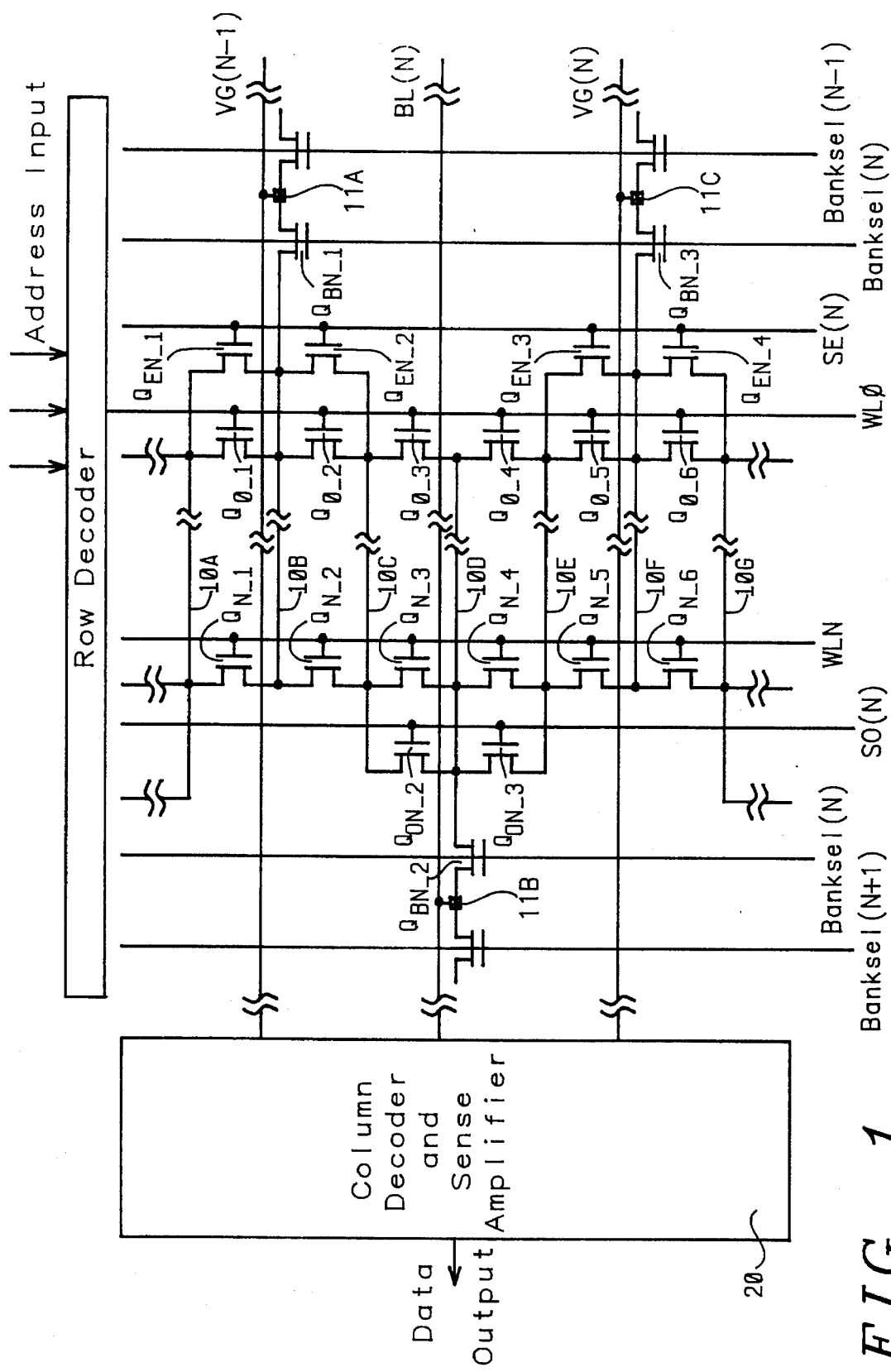
FIG. 1 is a circuit diagram of a small portion of a ROM cell array comprising an array of FET transistors, conductive bit and word lines, a row decoder and a column-decoder-and- sense-amplifier in accordance with this invention.

FIG. 1 is a circuit diagram of a small portion of a ROM cell array comprising an array of FET transistors, conductive bit and word lines, a row decoder 18 and a column-decoder-and-sense-amplifier 20 in accordance with this invention. The array of FET transistors shown extends from column 1 to column 6 and from row 0 to row N. In addition, there are N banks in the overall ROM cell array which extends from bank 0 to bank N-1 to bank N to bank N+i, etc., where FIG. 1 isolates bank N for purposes of explanation of the function of the system of this invention.

The portion of the ROM cell FET transistor array shown in FIG. 1 comprises several parallel (horizontally disposed) buried N+ local bit lines 10A, 10B, 10C, 10D, 10E, and 10F. Several (vertically disposed) polysilicon word lines WL0 to WLN (only the first and last of which are shown for convenience of illustration) are laid perpendicular to the buried N+ local bit lines. This ROM cell FET transistor array stores data by coding them with code implantation.

The ROM cell array is read by raising one word line to a voltage which is preferably less than or equal to 5 Volts, and sensing the bit line current to determine the "1" value or the "0" value. If the bit line current is larger than the ON cell current, it reads a "0" value. If the bit line current is smaller than the off cell current, it reads a "1" value. A certain cell is accessed, and the sense amplifier 20 senses the current on a main bit line VG(N-1), BL(N), and VG(N) adjacent to the driven bit line to determine the stored data in one cell of the ROM cell array. This sensing scheme is referred to as the "virtual ground sensing technique."

The main bit lines labeled as VG(N-1), BL(N), and VG(N) are preferably composed of metal. There are buried N+ bit lines labeled as 10A, 10B, 10C, 10D, 10E, 10F and 10G extending parallel to the main bit lines VG(N-1), BL(N), and VG(N). There are bank select FET transistors, labeled as $Q_{BN\_1}$, $Q_{BN\_2}$, and $Q_{BN\_3}$ whose gates are connected to the lines BANKSEL(N). The metal main bit lines VG(N-1), BL(N), VG(N) connect to the buried N+ drains of the bank select FET transistors $Q_{BN\_1}$, $Q_{BN\_2}$, and $Q_{BN\_3}$ through the contact 11A, contact 11B, and contact 11C respectively. The bank select FET transistors $Q_{BN\_1}$, $Q_{BN\_2}$, and $Q_{BN\_3}$ are responsible for the selection of this bank, i.e. bank "N." If bank "N" is selected, the signal from the metal main bit lines VG(N-1), BL(N) and VG(N) can couple into the local N+ bit lines 10B, 10D and 10F through the conduction of bank select FET transistors $Q_{BN\_1}$, $Q_{BN\_2}$, and $Q_{BN\_3}$ respectively.

There are four "even" select FET transistors $Q_{EN\_1}$, $Q_{EN\_2}$, $Q_{EN\_3}$ and $Q_{EN\_4}$ which have their gates connected to the "even" select line SE(N). In addition there are two "odd" select FET transistors $Q_{ON\_2}$, and $Q_{ON\_3}$ having their gates connected to the "odd" select line SO(N).

Note that between two buried N+ bit lines 10D and 10F, there are two columns of cells from row "0" to row "N", the first column comprising cells $Q_{O\_4}$–$Q_{N\_4}$ and the second column comprising $Q_{O\_5}$–$Q_{N\_5}$. By raising the "even" select word line SE(N) or the "odd" select word line SO(N), local buried N+ bit line 10E connects either to local buried N+ bit line 10D or 10F respectively. This means only one of the ROM cell array columns $Q_{O\_4}$–$Q_{N\_4}$ or $Q_{O\_5}$–$Q_{N\_5}$ is accessed in one read cycle.

In FIG. 1, as described above, a two step decoding scheme is employed for accessing a single cell, i.e. the bank select FET transistors $Q_{BN\_1}$, $Q_{BN\_2}$, and $Q_{BN\_3}$ and the select FET transistors $Q_{EN\_1}$, $Q_{EN\_2}$, $Q_{EN\_3}$ $Q_{EN\_4}$, $Q_{ON\_2}$, and $Q_{ON\_3}$. To access a single cell, requires (1) raising not only one of the array of word lines WL0–WLN, but also requires (2) raising one of the related bank select FET transistors (such as $Q_{BN\_1}$, $Q_{BN\_2}$, and $Q_{BN\_3}$) and (3) raising one of the select FET transistors. The bank select FET transistor of the non-select bank are off. This means the signals from the metal main bit lines VG(N-1), BL(N), VG(N) are blocked outside the non-select banks. Even though the word lines in this bank are high, this does not necessarily form a current path in this bank, unless the bank is selected. This allows the word lines of different banks of the ROM to share the same row decoder by controlling the bank select FET transistors "ON" or "OFF". The present invention greatly improves the layout pitch. For the high density mask ROM, the layout pitch of the ROW decoder is a significant problem because the cell pitch is smaller than ever. By insertion of bank select FET transistors, this problem is easily solved.

For the detailed explanation of the operation principle, the reading of $Q_{O\_4}$ is chosen, for example. Note that the data are stored in the cells of the ROM array by means of applying code implantation or not. If code implantation is applied, the threshold voltage is strongly enhanced and the current of the sense path is under the sense level of sense amplification. It reads state "1." The principle of operation is as follows:

(i) To select bank "N" the bank select word line BANKSEL(N) for bank "N" must be activated. As was explained above, bank select FET transistors QB0_1 to QBN+1_3, etc. (for banks from bank 0 to bank N+1) partition the whole cell FET transistor array into several banks (0 . . . N-I, N, N+1 . . . ) only one bank of which is illustrated, comprising bank N. So when BANKSEL(N) is activated, then bank select transistors for bank N, i.e. $Q_{BN\_1}$, $Q_{BN\_2}$, and $Q_{BN\_3}$ are in the "ON" state.

(ii) Select line SE(N) must be selected, so $Q_{EN\_3}$ is turned on.

(iii) Word line WL0 must be selected.

The sense amplifier 20 senses the current of the whole path to distinguish a "0" value or a "1" value state. Metal main bit line BL(N) is connected to the sense amplifier 20. The current path is BL(N) to contact 11B to $Q_{BN\_2}$, to 10D to $Q_{O\_4}$ to 10E to $Q_{EN\_3}$ to 10F to $Q_{BN\_3}$ to contact 11C to VG(N). The final metal virtual ground bit line VG(N) is connected to ground potential. In this current path all FET transistors are normally buried N+ FET transistors, except for accessed cell $Q_{O\_4}$. It stores data by selectively applying the code implant or not applying the code implant. Thus, the state of cell $Q_{O\_4}$ determines the current of the whole path. If no current exists, the sense amplifier 20 reads a "1" value. If current does exist, the sense amplifier 20 reads a "0" value.

Figure 2:
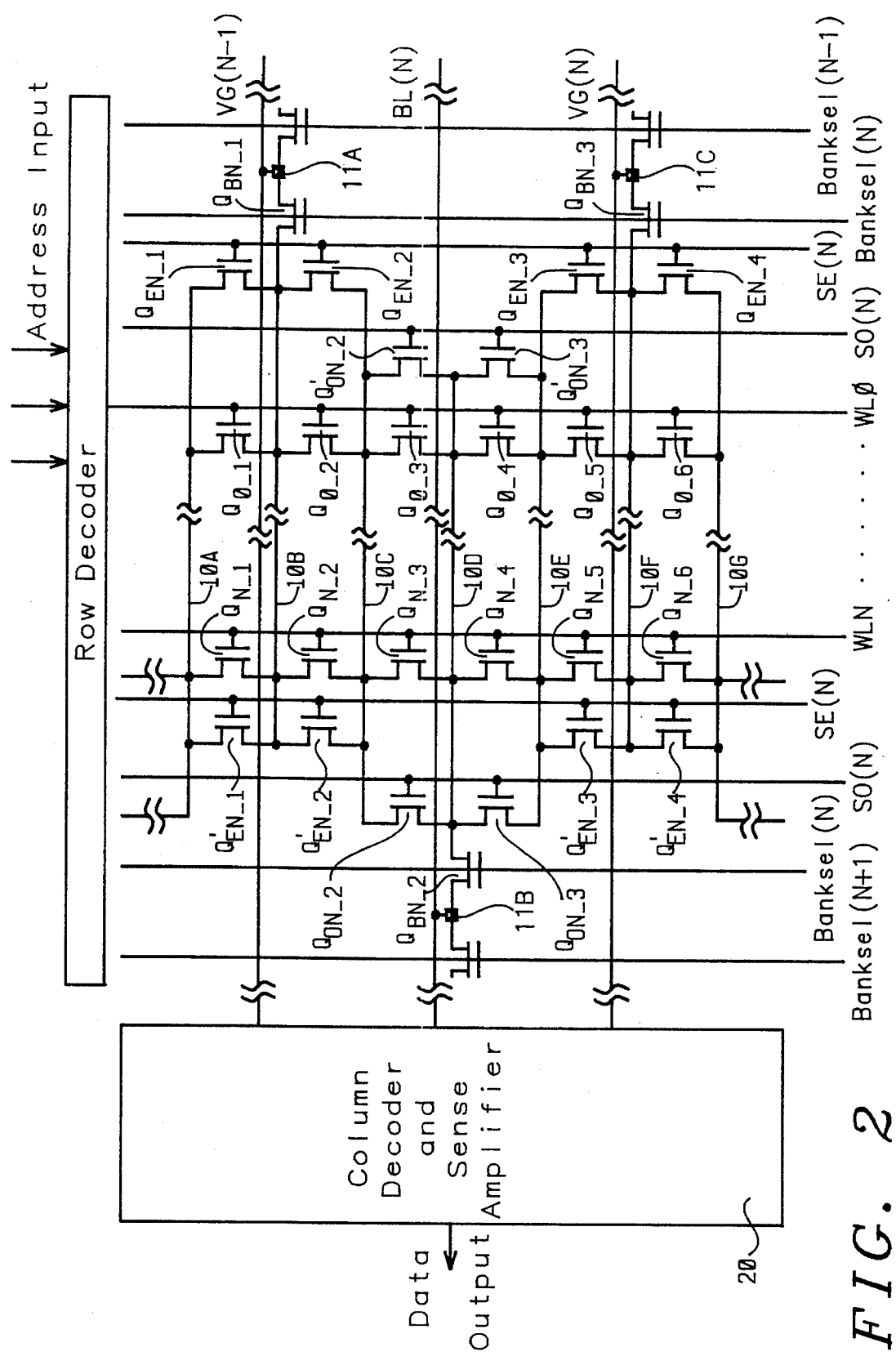
FIG. 2 is another embodiment of this invention with double select FET transistors.

FIG. 2 is another embodiment of this invention. Note that in FIG. 2 there are double select FET transistors $Q_{EN\_1}$ plus $Q'_{EN\_1}$, $Q_{EN\_2}$ plus $Q'_{EN\_2}$, $Q_{EN\_3}$ plus $Q'_{EN\_3}$, and $Q_{EN\_4}$ plus $Q'_{EN\_4}$ connected to the "even" select line SE(N), and the $Q_{ON\_2}$ plus $Q'_{ON\_2}$, $Q_{ON\_3}$ plus $Q'_{ON\_3}$ connected to the "odd" select line SO(N). In FIG. 1, the current path goes through two buried N+ bit lines 10D and 10E. Only one FET transistor $Q_{EN\_3}$ connects two buried N+ bit lines 10E and 10F In FIG. 2 two FET transistors $Q_{EN\_3}$ and $Q'_{EN\_3}$ which are connected to "even" select lines SE(N) are responsible for coupling bit lines 10E and 10F. This parallel connection of between lines 10E and 10F reduces the total resistance between bit lines 10E and 10F and reduces the total resistance of the current path, dramatically. The larger is the sense current generated, the greater the margin permitted for operation of sense amplifier 20. Accordingly, the sense amplifier 20 is easier to design.

In fact, the number of select FET transistors $Q'_{EN\_1}$, plus $Q'_{EN\_1}$ and $Q_{ON\_2}$ plus $Q'_{ON\_2}$ is not restricted to two. It can be more than two, and also these select FET transistors can he located anywhere along the bank.

Figure 3:
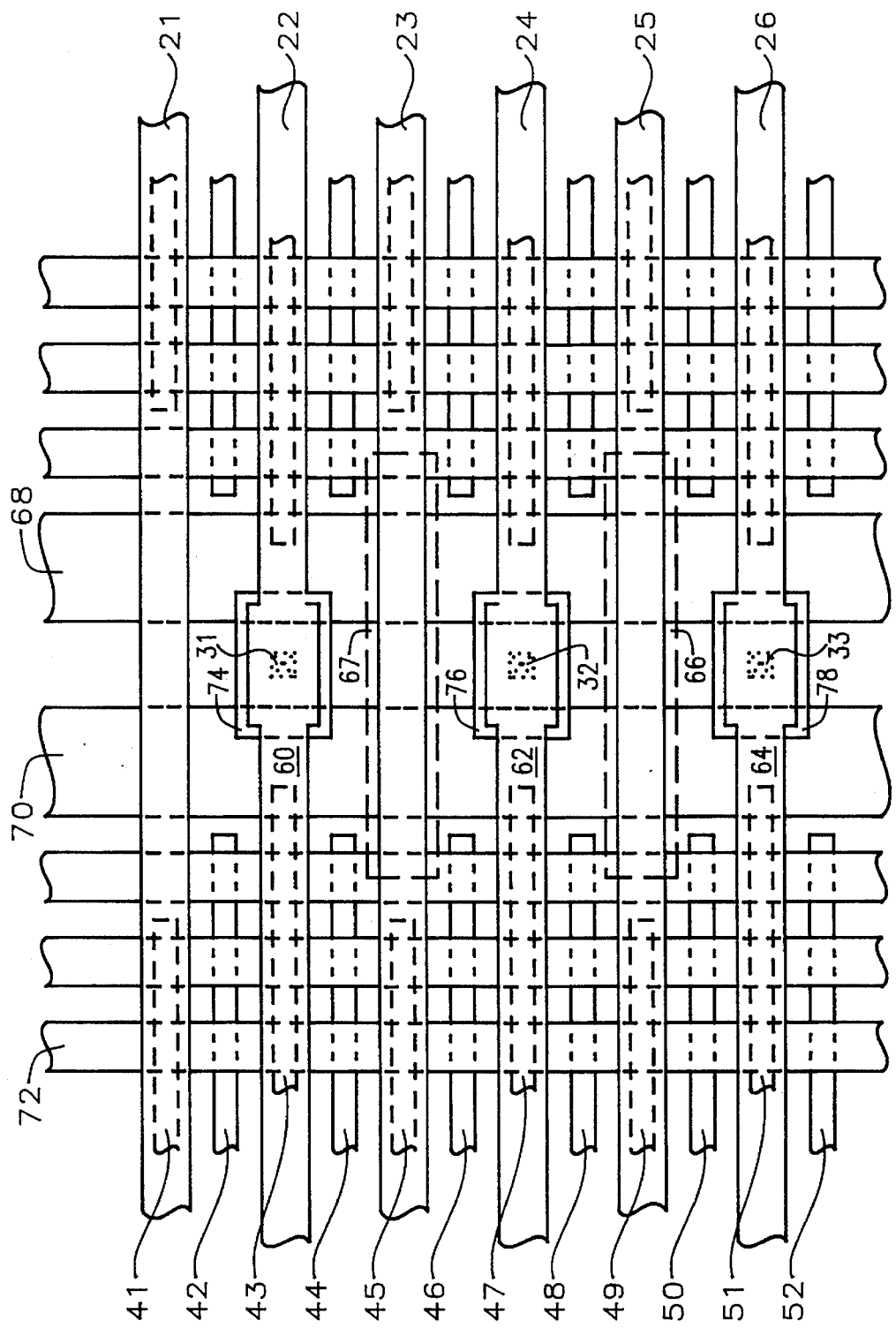
FIG. 3 illustrates the layout of a ROM cell FET transistor array embodying the circuit shown in FIG. 1.

FIG. 3 illustrates the layout of a ROM cell FET transistor array embodying the circuit shown in FIG. 1. The metal main hit lines comprise lines 21–26 extending parallel to each other along the vertical direction. The metal main bit lines 21–26 overlie alternate ones of the buried N+ hit lines 41 to 52 which extend in parallel in a layer beneath the metal main hit lines 21–26. There are diffusion contacts 31, 32 and 33 for connection of the metal bit lines 22, 24 and 26 into the buried N+ drains of bank select FET transistors extending downwardly. The bank select FET transistors are normally buried N+ FET transistors, because the buried N+ deposition process step is performed before the polysilicon deposition. So there must be an overlap of buried N+ and polysilicon to assure the desired proximity and positioning of the drains and gates.

Through the gates of bank select FET transistors 60, 62 and 64, the even numbered metal main bit lines 22, 24 and 26 can couple into buried N+ bit lines 43, 47 and 51 in the cell FET transistor array. The diffusion contact of odd numbered metal main bit lines 21, 23 and 25 is on the next bank below or the bank above the bank shown in FIG. 3. Through the diffusion contacts 31, 32 and 33 and their bank select FET transistors, the metal main bit lines 21, 23 and 25 can couple into the buried N+ bit line diffusions 41, 45 and 49. So, there are two columns of cells between the buried N+ bit lines 43, 47, 51 and the buried N+ bit lines 41, 45 and 49, respectively. One of these two columns is chosen by activating the even select word line SE(N). Because the select FET transistor is ON, the buried N+ bit lines 42, 44, 46, 48 and 50 are coupled to the buried N+ bit lines 43, 47 and 51. Boron 11 PN Junction isolation regions 66 and 67 are provided aligned with the bit lines 23 and 25 between the BN+ regions 74, 76 and 78 which surround the diffusion contacts 31, 32 and 33. Bank select word lines 68 and 70 extend transversely of the device overlapping the periphery of the BN+ regions 74, 76 and 78. Polysilicon word line 72 is one of an array of word lines which extend from right to left.

Figure 4:
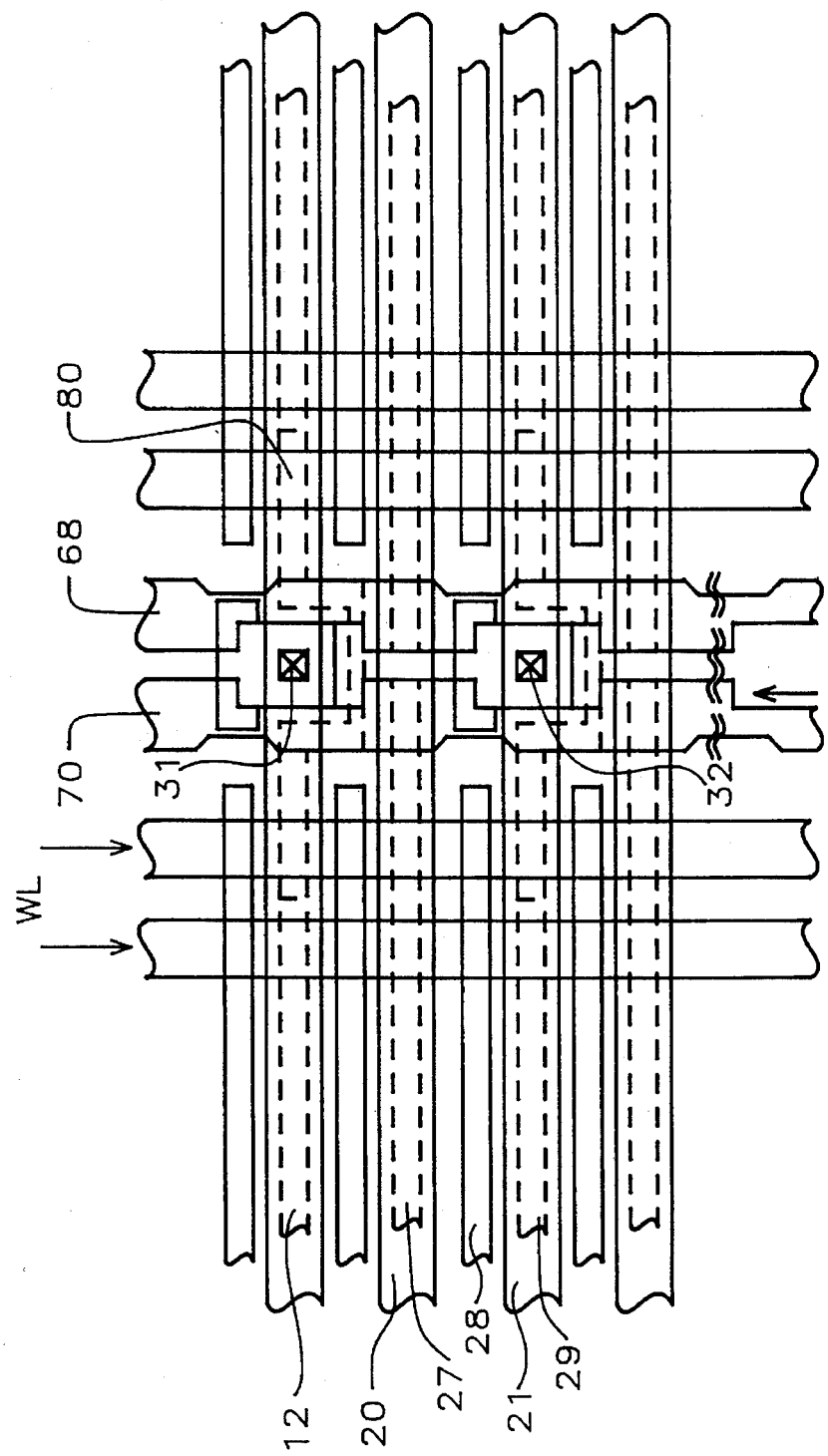
FIG. 4 illustrates another layout of this invention shown in FIG. 1.

FIG. 4 illustrates another layout of this invention shown in FIG. 1. The channel direction of the bank select FET transistor is parallel to that of the ROM cell FET transistor array. So, even the polysilicon misalignment to the buried N+ does not affect the characteristics of the bank select FET transistors. And, the channel width of the bank select FET transistors is much wider than that in FIG. 3. This also enlarges the sense current of the whole sense path. A PN Junction isolation B11 code implant is shown above diffusion contact 31. The remainder of the layout is all the same as described above relative to FIG. 3.

The polysilicon gate layer referred to herein is not restricted to polysilicon, but can be composed of other materials which are substantially polycrystalline, or are amorphous and contain a large fraction of silicon, in a form such as polycide.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A read only memory cell array comprising:

an array of memory transistor cells , a plurality of word lines, a plurality of buried bit lines, a plurality of main bit lines parallel to said buried bit lines, with said main bit lines overlying alternate ones of said buried bit lines, a plurality of sets of parallel columns of said memory transistor cells in said array including a first set of columns of cells and a second column of cells, said first and second columns being in side by side parallel relationship, diffusion contacts connecting said main bit lines to bank select transistors, a plurality of bank select lines for enabling a reading of a selected bank in said array connected to said bank select transistors in said bank, a select even line adapted for enabling reading of a first set of said transistor cells in said first column of cells in a selected bank connected to select said first set of said transistor cells in said bank, and a select odd line adapted for enabling reading of a second set of said transistor cells in said second column of cells next in said array to said first column of cells in a selected bank connected to select said second set of said transistor cells in said array.

2. A read only memory cell array in accordance with claim i wherein said select even lines are connected to the gates of FET transistors which are connected to said first set of transistor cells in said array, and said select odd lines are connected to the gates of FET transistors which connect to said second set of transistor cells in said array.

3. A read only memory cell array in accordance with claim 1 wherein said FET transistors connect to said bit lines of said second set of transistor cells and said first set of transistor cells respectively.

4. A read only memory cell array in accordance with claim i wherein said bank select transistors are connected to energize a first set of transistor cells and a second set of transistor cells, when said bank select transistors are energized.

5. A read only memory cell array in accordance with claim 1 wherein said buried bit lines comprise buried N+ bit lines, and said bank select transistors are connected to the column decoder of said cell array.

6. A read only memory cell array in accordance with claim 5 wherein said select even lines which connect to the gates of FET transistors which connect to first set of transistor cells in said array, and said select odd lines are connected to the gates of FET transistors which connect to the gates of FET transistors which connect to said second set of transistor cells in said array.

7. A read only memory cell array in accordance with claim 5 wherein said transistor cells connect to said bit lines of said first set of transistors and said second set of transistors respectively for selective energization of said cells.

8. A read only memory cell array in accordance with claim 6 wherein said bank select transistors are connected to energize said first set of transistors and said second set of transistors, when said bank select transistors are energized.

9. A read only memory cell array in accordance with claim 7 wherein said buried bit lines comprise buried N+ bit lines, and said bank select transistors are connected to the column decoder of said cell array.

10. A method of operating a read only memory cell array comprising:

an array of memory transistor cells, a plurality of word lines, a plurality of buried bit lines, a plurality of main bit lines parallel to said buried bit lines, with said main bit lines overlying alternate ones of said buried bit lines, a plurality of sets of parallel columns of said memory transistor cells in said array including a first set of columns of cells and a second column of cells, said first and second columns being in side by side parallel relationship, diffusion contacts connecting said main bit lines to a set of bank select transistors, employing a plurality of bank select lines for enabling a reading of a selected bank in said array connected to said bank select transistors in said bank, employing a select even line adapted for enabling reading of a first set of transistor cells in said first column of cells in a selected bank connected to select said first set of said transistor cells in said bank, and employing a select odd line adapted for enabling reading of a second set of transistor cells in said second column of cells next in said array to said first column of cells in a selected bank connected to select said second set of transistor cells in said array.

11. A method of operating a read only memory cell array in accordance with claim 12 wherein said select even lines are connected to the gates of FET transistors which are connected to said first set of transistor cells in said array, and said select odd lines are connected to the gates of FET transistors which connect to said second set of transistor cells in said array.

12. A method of operating a read only memory cell array in accordance with claim 11 wherein said FET transistors connect to said bit lines of said second set of transistor cells and said first set of transistor cells respectively.

13. A method of operating a read only memory cell array in accordance with claim 10 wherein said bank select transistors are connected to energize a first set of transistor cells and a second set of transistor cells, when said bank select transistors are energized.

14. A method of operating a read only memory cell array in accordance with claim 10 wherein said buried bit lines comprise buried N+ bit lines.

15. A method of operating a read only memory cell array in accordance with claim 14 wherein said bank select transistors are connected to the column decoder of said cell array.

16. A method of operating a read only memory cell array in accordance with claim 14 wherein said select even lines which connect to the gates of FET transistors which connect to said first set of transistor cells in said array, and said select odd lines are connected to the gates of FET transistors which connect to said second set of transistor cells in said array.

17. A method of operating a read only memory cell array in accordance with claim 15 wherein said cell transistors connect to said bit lines of said first set of transistor cells and said second set of transistor cells respectively for selective energization of said cells.

18. A method of operating a read only memory cell array in accordance with claim 16 wherein said bank select transistors are connected to energize said first set of transistor cells and said second set of transistor cells, when said bank select transistors are energized.

19. A method of operating a read only memory cell array in accordance with claim 17 wherein said buried bit lines comprise buried N+ bit lines.

20. A method of operating a read only memory cell array in accordance with claim 18 wherein said bank select transistors are connected to the column decoder of said cell array.

21. A method of operating a read only memory cell array comprising:

an array of memory transistor cells, a plurality of word lines, a plurality of buried bit lines comprising buried N+ bit lines, a plurality of main bit lines parallel to said buried bit lines, with said main bit lines overlying alternate ones of said buried bit lines, a plurality of sets of parallel columns of said memory transistor cells in said array including a first set of columns of cells and a second column of cells, said first and second columns being in side by side parallel relationship, diffusion contacts connecting said main bit lines to a set of bank select transistors, employing a plurality of bank select lines for enabling a reading of a selected bank in said array connected to said bank select transistors in said bank, employing a select even line adapted for enabling reading of a first set of transistor cells in said first column of cells in a selected bank connected to select said first set of said transistor cells in said bank, and employing a select odd line adapted for enabling reading of a second set of transistor cells in said second column of cells next in said array to said first column of cells in a selected bank connected to select said second set of transistor cells in said array, said select even lines connecting to the gates of FET transistors which connect to said first set of transistor cells in said array, and said select odd lines connecting to the gates of FET transistors which connect to said second set of transistor cells in said array, said FET transistors connecting to said bit lines of said second set of transistor cells and said first set of transistor cells respectively, said bank select transistors connecting to energize a first set of transistor cells and a second set of transistor cells, when said bank select transistors are energized, said cell transistors connecting to said bit lines of said first set of transistor cells and said second set of transistor cells respectively for selective energization of said cells.

22. A read only memory cell array in accordance with claim 8 wherein said bank select transistors are buried N+ FET transistors.

\* \* \* \* \*